United States Patent
Jung et al.

(10) Patent No.: US 10,761,225 B2
(45) Date of Patent: Sep. 1, 2020

(54) SHIFT REGISTER, GATE DRIVER CIRCUIT, X-RAY DETECTION PANEL, AND X-RAY DETECTOR

(71) Applicant: LG DISPLAY CO., LTD., Seoul (KR)

(72) Inventors: ChanYong Jung, Chilgok-gun (KR); MoonSoo Kang, Daegu (KR); ChangMin Woo, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 16/230,832

(22) Filed: Dec. 21, 2018

(65) Prior Publication Data

US 2019/0196031 A1    Jun. 27, 2019

(30) Foreign Application Priority Data

Dec. 27, 2017 (KR) .................. 10-2017-0181206

(51) Int. Cl.
| | | |
|---|---|---|
| *H04N 5/376* | (2011.01) | |
| *G01T 1/24* | (2006.01) | |
| *H04N 5/32* | (2006.01) | |
| *G11C 19/28* | (2006.01) | |

(52) U.S. Cl.
CPC ............. *G01T 1/247* (2013.01); *H04N 5/32* (2013.01); *H04N 5/376* (2013.01); *G11C 19/28* (2013.01)

(58) Field of Classification Search
CPC .......... H04N 5/32; H04N 5/376; G01T 1/247; G11C 19/28
See application file for complete search history.

(56) References Cited

U.S. PATENT DOCUMENTS

| | | | | |
|---|---|---|---|---|
| 8,680,478 | B2 * | 3/2014 | Ofuji ................. | H01L 27/14663 250/394 |
| 9,048,154 | B2 * | 6/2015 | Takenaka .......... | H01L 27/14612 |
| 2013/0264487 | A1 | 10/2013 | Okada et al. | |

FOREIGN PATENT DOCUMENTS

| | | |
|---|---|---|
| EP | 2549299 A2 | 1/2013 |
| EP | 2640066 A2 | 9/2013 |
| JP | 2011-216723 A | 10/2011 |

* cited by examiner

*Primary Examiner* — David P Porta
*Assistant Examiner* — Fani Boosalis
(74) *Attorney, Agent, or Firm* — Birch, Stewart, Kolasch & Birch, LLP

(57) ABSTRACT

An X-ray detection panel and a gate driver circuit driving gate lines disposed on the X-ray detection panel are discussed. A high-level scanning signal is output to the gate lines before X-rays are input to the X-ray detection panel, and a low-level scanning signal is input to the gate lines during an X-ray incidence period in which electrical charges are generated in pixels. Gate driving for accurate X-ray reading is enabled. The gate driver circuit is provided as a gate-in-panel (GIP) using transistors operating in response to an X-ray incidence signal. An X-ray detection panel that is able to accurately read X-rays can be provided.

15 Claims, 12 Drawing Sheets

Case 1

Case 2

Shift Register : Case 1

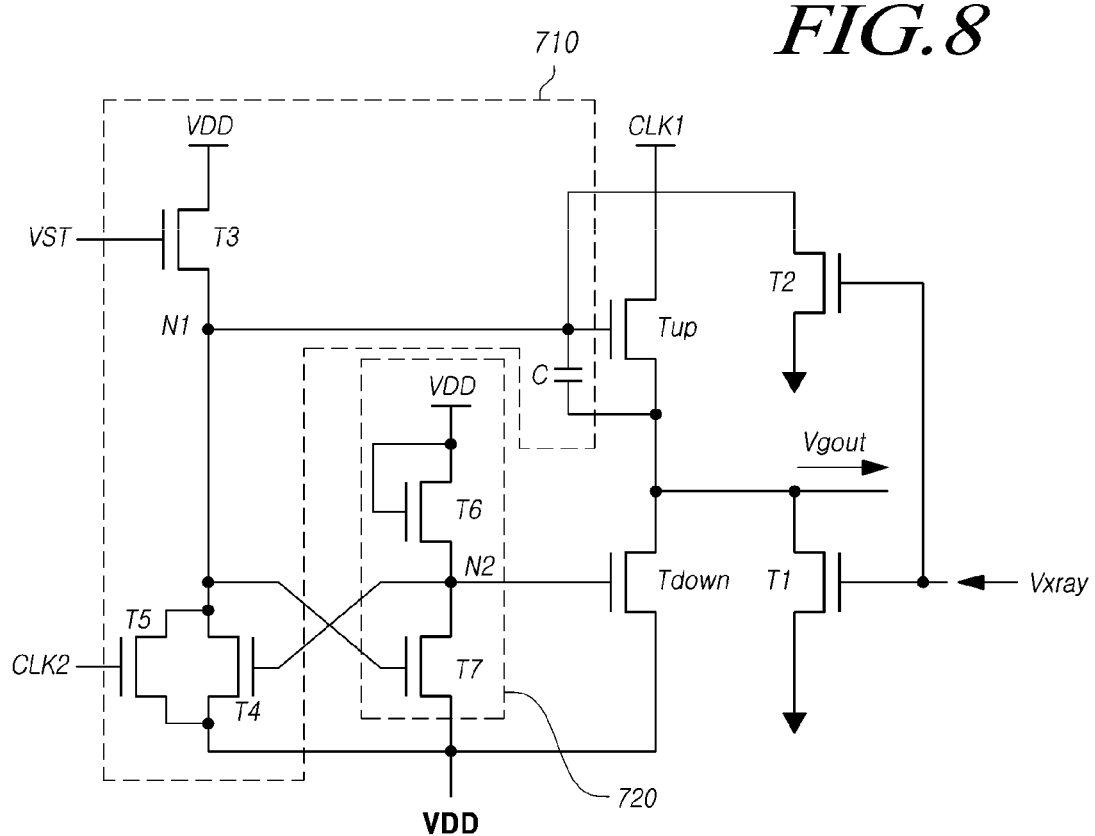
FIG.8
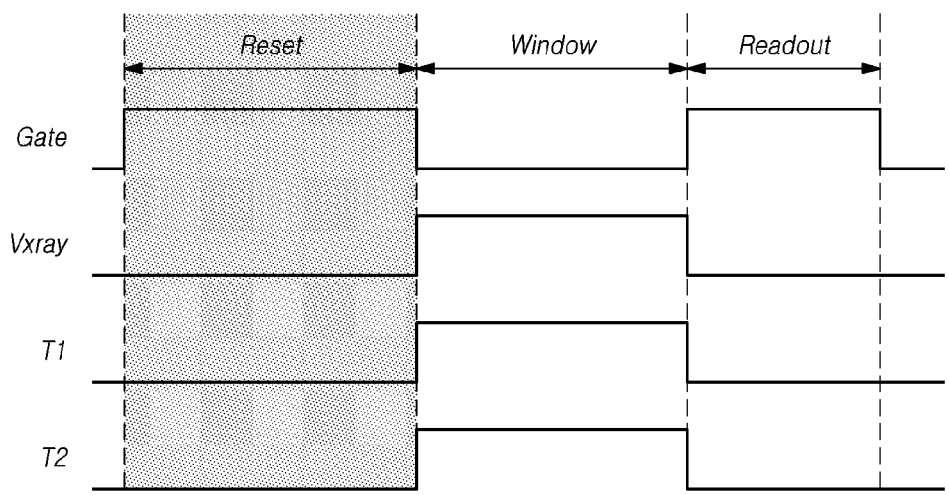

SHIFT REGISTER, GATE DRIVER CIRCUIT, X-RAY DETECTION PANEL, AND X-RAY DETECTOR

CROSS REFERENCE TO RELATED APPLICATION

This application claims priority to Korean Patent Application No. 10-2017-0181206 filed on Dec. 27, 2017 in Republic of Korea, which is hereby incorporated by reference for all purposes as if fully set forth herein.

BACKGROUND

Field

The present disclosure relates to a shift register, a gate driver circuit, an X-ray detection panel, and an X-ray detector.

Description of Related Art

In general, medical or industrial X-ray detectors (or X-ray imaging devices) capturing images by fluoroscoping regions of patient bodies or objects using the transmitting properties of X-rays are widely used. In addition, recently digital X-ray detectors digitizing images captured using X-rays are used in the place of film-type X-ray detectors, in response to the development of digital technology.

Such a digital X-ray detector is configured to produce a digital image by reading X-rays emitted by an X-ray emitter when the X-rays are incident to an X-ray detection panel after having passed through a subject.

The X-ray detection panel may include a plurality of gate lines, a plurality of data lines, and a plurality of pixels, i.e., areas defined by the intersection of the gate lines and the data lines, like a typical display panel. However, unlike a typical display panel, a light-receiving element may be disposed in each of the pixels instead of a light-emitting element.

The X-ray detection panel can read X-rays incident thereto by reading electrical charges through the data lines, the electrical charges being generated by light-receiving elements using incident X-rays or visible light converted from the X-rays, and provide a digital image based on the electrical charges.

The X-ray detection panel can read X-rays and generate a digital image by reading levels of electrical charges generated by X-rays incident on the pixels, instead of causing the elements disposed in the pixels to emit light. Accordingly, it is necessary to accurately control charge generation periods in the pixels in order to accurately read X-rays.

Accordingly, a method of driving gate lines and data lines of an X-ray detection panel, different from a method of driving gate lines or data lines in typical display panels, is demanded.

BRIEF SUMMARY

Various aspects of the present disclosure provide a gate driver circuit, a method of driving the same, and an X-ray detection panel, by which X-rays can be accurately read in an X-ray detector.

Also provided are a gate driver circuit, which is disposed within an X-ray detection panel to control the driving timing of the X-ray detection panel, a method of driving the same, and a shift register included in the gate driver circuit.

According to an aspect of the present disclosure, an X-ray detection panel can include a plurality of gate lines, a plurality of data lines intersecting the plurality of gate lines, a plurality of pixels comprised of areas defined by the intersection of the plurality of gate lines and the plurality of data lines, a gate driver circuit outputting a scanning signal to the plurality of gate lines, a readout circuit detecting signals from the plurality of data lines, and a controller controlling the gate driver circuit and the readout circuit and outputting an X-ray incidence signal to the gate driver circuit.

The gate driver circuit can output a first-level scanning signal to the plurality of gate lines during at least a portion of a first period before the X-ray incidence signal is input, and output a second-level scanning signal to the plurality of gate lines during a second period in which the X-ray incidence signal is input.

According to another aspect of the present disclosure, a gate driver circuit can include a first shift register outputting a scanning signal to a first gate line, and a second shift register outputting a scanning signal to a second gate line. The first shift register and the second shift register output a first-level scanning signal to the first gate line and the second gate line, respectively, during at least a portion of a first period before an X-ray incidence signal is input, and simultaneously output a second-level scanning signal to the first gate line and the second gate line during a second period in which the X-ray incidence signal is input.

According to another aspect of the present disclosure, a shift register can include a pull-up transistor controlling a first-level scanning signal to be output to an output terminal, a pull-down transistor controlling a second-level scanning signal to be output to the output terminal, a first transistor connected to the output terminal, and a second transistor connected to a gate node of the pull-up transistor. The first transistor and the second transistor are turned on simultaneously during a period in which an X-ray incidence signal is input and are turned off except for the period in which the X-ray incidence signal is input.

According to another aspect of the present disclosure, an X-ray detector can include a panel provided with a plurality of gate lines, a plurality of data lines, and a plurality of pixels; a gate driver circuit outputting a scanning signal to the plurality of gate lines; a readout circuit detecting signals from the plurality of data lines; and a controller controlling the gate driver circuit and the readout circuit and outputting an X-ray incidence signal to the gate driver circuit. The gate driver circuit outputs a first-level scanning signal to the plurality of gate lines during at least a portion of a first period before the X-ray incidence signal is input, and outputs a second-level scanning signal to the plurality of gate lines during a second period in which the X-ray incidence signal is input.

According to one or more embodiments, the X-ray detector can discharge electrical charges from the X-ray detection panel before the incidence of X-rays, so that X-rays can be accurately read.

According to one or more embodiments, since signals output from the gate driver circuit are maintained at an off level during a period in which X-rays are incident to the X-ray detection panel, a sufficient period in which electrical charges are generated by the X-rays can be provided.

According to one or more embodiments, since the gate driver circuit performing the above-described driving is disposed within the X-ray detection panel as a built-in circuit, the X-ray detector that is able to accurately read X-rays can be easily provided.

BRIEF DESCRIPTION OF THE DRAWINGS

The above and other objects, features, and advantages of the present disclosure will be more clearly understood from the following detailed description when taken in conjunction with the accompanying drawings, in which:

FIGS. 8 to 10 illustrate examples of the driving methods of the shift register illustrated in FIG. 7;

DETAILED DESCRIPTION OF THE EMBODIMENTS

Figure 1:
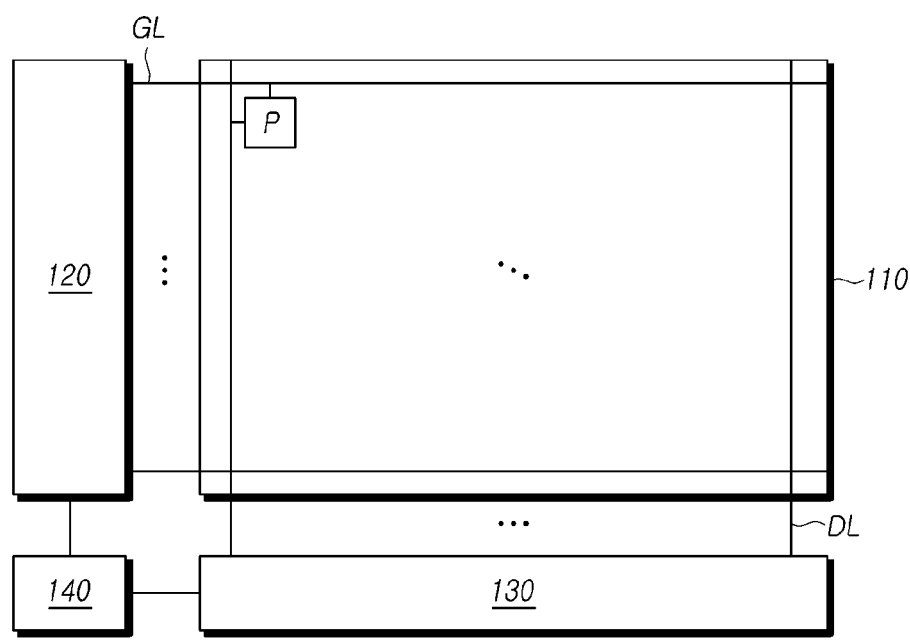
FIG. 1 schematically illustrates a configuration of an X-ray detector according to an embodiment.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

FIG. 1 schematically illustrates a configuration of an X-ray detector 100 according to embodiment(s). All the components of the X-ray detector according to all embodiments are operatively coupled and configured.

Referring to FIG. 1, the X-ray detector 100 according to the embodiment(s) can include an X-ray detection panel 110 in which a plurality of gate lines GL and a plurality of data lines DL are disposed, a gate driver circuit 120 for outputting a scanning signal to the plurality of gate lines GL, a readout circuit 130 for detecting signals from the plurality of data lines DL, a controller 140 for controlling the gate driver circuit 120 and the readout circuit 130, and the like.

The plurality of gate lines GL and the plurality of data lines DL are disposed on the X-ray detection panel 110. A plurality of pixels P may be defined by the intersection of the gate lines GL and the data lines DL.

In the pixels P, transistors, capacitors, photodetectors, and the like, operating in response to a scanning signal applied through the gate lines, may be disposed. When X-rays are incident, the photodetectors can generate electrical charges by responding to the X-rays or visible light converted from the X-rays. The generated electrical charges can be accumulated in the capacitors.

The gate driver circuit 120 outputs a scanning signal to the plurality of gate lines GL and controls transistors connected to the gate lines GL.

The gate driver circuit 120 may include one or more gate driver integrated circuits (ICs), and may be located on one side or both sides of the X-ray detection panel 110, depending on a driving system. In addition, the gate driver circuit 120 may be provided as a gate-in panel (GIP) disposed within the X-ray detection panel 110.

The gate driver circuit 120 can output a first-level scanning signal for turning the transistors on and a second-level scanning signal for turning the transistors off to the gate lines GL. For example, the first level may be a high level, and the second level may be a low level. However, the present disclosure is not limited thereto.

The readout circuit 130 may be connected to the plurality of data lines DL to detect signals from the plurality of data lines DL.

The readout circuit 130 may include amplifiers, capacitors, and the like for detecting signals through the data lines DL, as well as multiplexers and the like for selecting one or more specific data lines among the plurality of data lines DL, through which signals are detected.

The readout circuit 130 can be controlled by the controller 140. At a point in time at which transistors disposed in pixels among the plurality of pixels P are turned on in response to a scanning signal applied thereto by the gate driver circuit 120, the readout circuit 130 can read electrical charges accumulated in the capacitors of the pixels P. The readout circuit 130 can convert the read-in electrical charges into digital data and transfer the converted data to the controller 140.

The controller 140 controls the operation of the gate driver circuit 120 and the readout circuit 130.

The controller 140 can output a variety of control signals to the gate driver circuit 120, and can control the driving timing of the gate driver circuit 120. In addition, the controller 140 can output a variety of control signals to the readout circuit 130, and can receive data from the readout circuit 130.

The controller 140 can read X-rays incident onto the X-ray detection panel 110, based on the data received from the readout circuit 130, and can generate a digital image.

The X-ray detector 100 may further include a power management IC generating a variety of power sources supplied to the gate driver circuit 120, the readout circuit 130, and the controller 140.

As described above, the X-ray detector 100 can read X-rays and generate a digital image by reading the levels of electrical charges in each pixel P among the pixels, generated by the X-rays incident to the X-ray detection panel 110, so that the digital image captured by the X-rays can be displayed by a display device.

Figure 2:
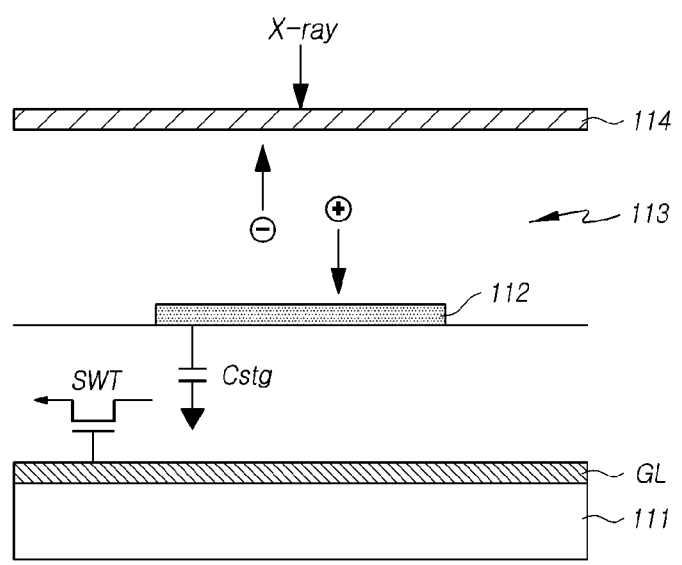
FIG. 2 illustrates a method in which the X-ray detector according to an embodiment detects X-rays incident to the X-ray detection panel.

FIG. 2 illustrates a method in which the X-ray detector 100 according to an embodiment detects X-rays incident to the X-ray detection panel 110.

Referring to FIG. 2, in the X-ray detection panel 110 according to the embodiment, a gate line GL, a bottom electrode 112, a photodetecting layer 113, and a top electrode 114 are disposed on a substrate 111.

The gate line GL may be connected to a switching transistor SWT disposed in each pixel P among the pixels. The switching transistor SWT can be turned on or off by a scanning signal applied through the gate line GL.

The photodetecting layer 113, which is responsive to light, may be disposed between the bottom electrode 112 and the top electrode 114. The photodetecting layer 113 can generate an electrical charge in response to X-rays incident to the X-ray detection panel 110 or visible light converted from the X-rays.

In addition, a scintillator converting incident X-rays to visible light may further be provided on the X-ray detection panel 110. Although the photodetecting layer 113 will hereinafter be described by way of example as being responsive to X-rays, the photodetecting layer responsive to visible light may also be included in embodiments.

When X-rays are incident, the photodetecting layer 113 can generate a level of electrical charge in response to the X-rays. The photodetecting layer 113 may be comprised of, for example, a PIN diode. In addition, the photodetecting layer 113, the bottom electrode 112, and the top electrode 114 may collectively be referred to as the PIN diode.

In this case, the photodetecting layer 113 may include an n-type semiconductor layer, a p-type semiconductor layer, and an intrinsic semiconductor layer (or i-type semiconductor layer) disposed between the n-type semiconductor layer and the p-type semiconductor layer. When the photodetecting layer 113 is exposed to X-rays, electrons and holes generated in the i-type semiconductor layer are driven to move, so that a level of electrical charge can be accumulated in a storage capacitor Cstg in each of the pixels P.

When the switching transistor SWT is turned on by a scanning signal applied through the gate line GL, a level of electrical charge accumulated in the storage capacitor Cstg can be detected through the data line DL. X-rays incident to the pixels P can be read and a digital image can be generated, based on differences in levels of electrical charges detected.

Since X-rays incident to the pixels P are read and a digital image is generated, based on the levels of electrical charges generated by X-rays incident to the X-ray detection panel 110, the levels of electrical charges within the pixels P are necessary to be set to be uniform before incidence of X-rays, so that X-rays can be accurately read. In addition, it is necessary to set charge generation periods for the pixels P, in which electrical charges are generated by X-rays, to be the same.

The X-ray detector 100 according to the embodiments provides a gate driving method by which X-rays can be accurately read.

Figure 3:
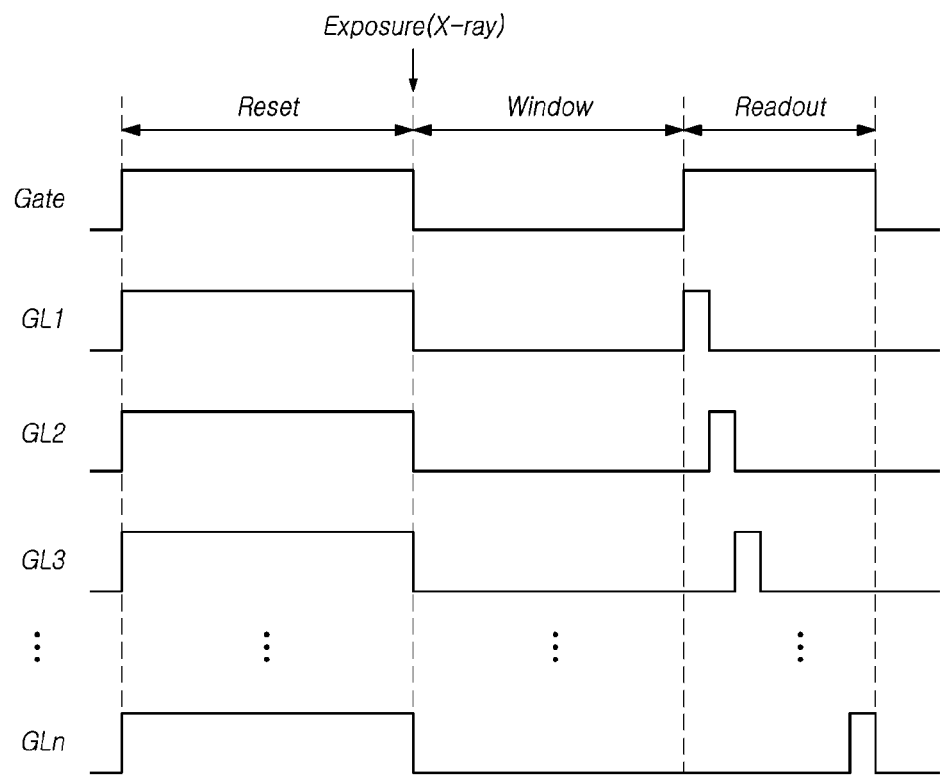
FIG. 3 illustrates examples of gate driving timing of the X-ray detector according to an embodiment.
Figure 3:
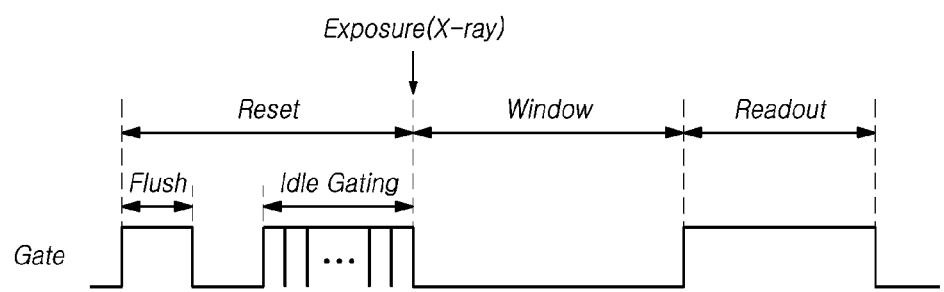

FIG. 3 illustrates examples of gate driving timing of the X-ray detector 100 according to an embodiment.

Referring to FIG. 3, the gate driver circuit 120 of the X-ray detector 100 according to the embodiment may operate while divided according to reset, window, and readout periods.

The reset period is a period before X-rays are incident to the X-ray detection panel 110, corresponding to a period in which electrical charges remaining in the pixels P are discharged.

Specifically, electrical charges may remain in the pixels P of the X-ray detection panel 110. For accurate X-ray reading, electrical charges remaining in the pixels P are necessary to be discharged before X-rays are incident.

The gate driver circuit 120 can output a first-level scanning signal to the plurality of gate lines GL during the reset period, the first-level scanning signal causing the switching transistor SWT to be turned on.

For example, the first-level scanning signal may be output simultaneously to all of the gate lines GL disposed on the X-ray detection panel 110 during the reset period (Case 1).

Alternatively, the first-level scanning signal may be output for one or more portions of the reset period so as to be output once or more during the reset period (Case 2).

As in Case 2, illustrated in FIG. 3, the first-level scanning signal may be output to all of the gate lines GL in a flush period during the reset period, so that electrical charges remaining in the pixels P can be discharged. In addition, the first-level scanning signal may be output at least once to the gate lines GL before the incidence of X-rays is started, thereby minimizing electrical charges remaining in the pixels P before the incidence of X-rays. Such gate driving is also referred to as "idle gating" or "free gating."

As described above, the electrical charges remaining in all of the pixels P are discharged during the reset period, so that X-ray reading can be accurately performed.

The window period corresponds to a period, in which X-rays are incident to the X-ray detection panel 110, and electrical charges are generated in the pixels P.

To generate a digital image by X-ray reading, differences in the levels of electrical charges generated by X-rays incident to the X-ray detection panel 110 need to be determined. Thus, it is necessary to equally control periods in which electrical charges are generated in all of the pixels P.

In addition, when the switching transistor SWT in any of the pixels P is turned on during the window period, electrical charges accumulated in the pixel P may be discharged. Thus, it is necessary to maintain the switching transistors SWT disposed in the pixels P in a turned-off state during the window period.

The gate driver circuit 120 outputs a second-level scanning signal simultaneously to the plurality of gate lines GL disposed on the X-ray detection panel 110 during the window period, the second-level scanning signal causing the switching transistors SWT to be turned off.

This consequently allows sufficient levels of electrical charges to be generated in the pixels during the window period. Since the charge generation periods are controlled to be the same, it is possible to accurately read X-rays by comparing the levels of electrical charges of the pixels P.

The readout period corresponds to a period in which the incidence of X-rays is stopped and levels of electrical charges generated by the pixels P are read.

The gate driver circuit 120 outputs a first-level scanning signal sequentially to the plurality of gate lines GL disposed on the X-ray detection panel 110 during the readout period. In addition, at points in time at which the first-level scanning signal is applied sequentially to the gate lines GL, the readout circuit 130 sequentially reads levels of electrical charges generated in the pixels P driven through the gate lines GL.

Thus, the X-ray detector 100 can read X-rays incident to the X-ray detection panel 110 and generate a digital image, based on the levels of electrical charges read by the readout circuit 130.

Although the gate driver circuit 120, performing the gate driving of the X-ray detector 100, may be connected to the X-ray detection panel 110 as an external circuit, the gate driver circuit 120 may be disposed within the X-ray detection panel 110 as a built-in circuit.

Figure 4:
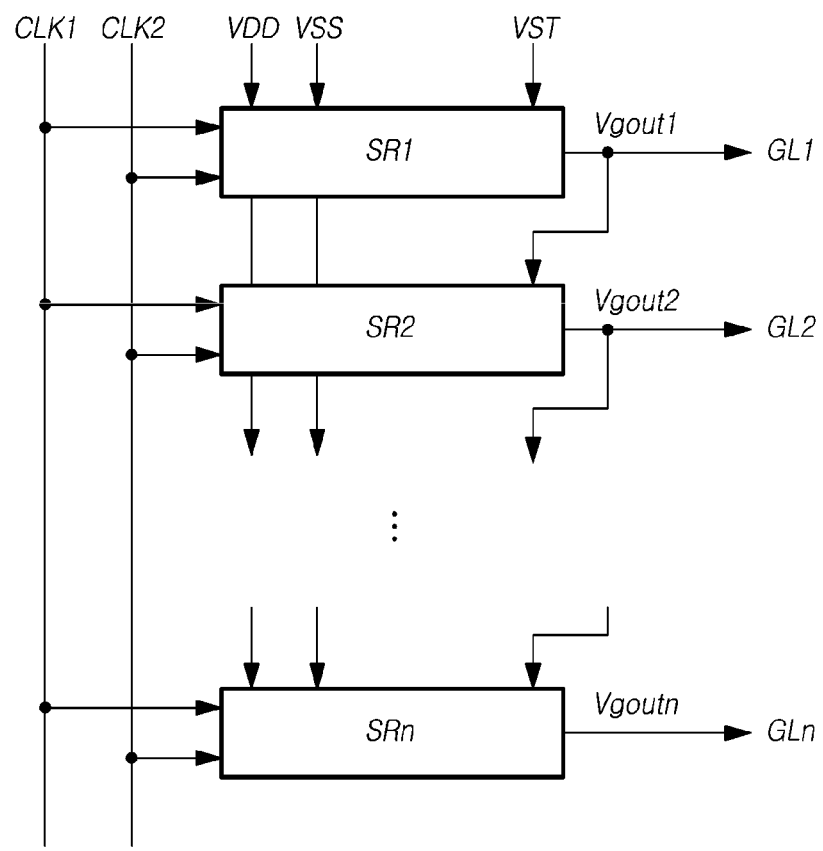
FIG. 4 schematically illustrates a configuration of the gate driver circuit of the X-ray detector according to an embodiment.

FIG. 4 schematically illustrates a configuration of the gate driver circuit 120 of the X-ray detector 100 according to an embodiment.

Referring to FIG. 4, the gate driver circuit 120 according to the embodiment may include a plurality of shift registers SR connected to the plurality of gate lines GL, respectively, to output a scanning signal to the gate lines GL connected thereto.

Each of the shift registers SR (e.g., SR1, SR2, ... SRn) can receive a first power voltage VDD, a second power voltage VSS, and two or more timing control signals, and can output a scanning signal to a gate line, among the plurality of gate lines GL, corresponding thereto.

For example, each of the shift registers SR can receive a first clock signal CLK1 and a second clock signal CLK2, and can output a scanning signal by receiving a gate start signal VST or a scanning signal output from another shift register SR. Although the present embodiment is illustrated as using two clock signals, four or eight clock signals may be used in some cases. Other examples are possible.

Each of the shift registers can output a first-level scanning signal or a second-level scanning signal to a corresponding gate line GL, based on a power voltage, a timing control signal, or the like, input thereto.

During the readout period, a first shift register SR1 to an nth shift register SRn of the shift registers SR can drive the plurality of gate lines GL by sequentially outputting a first-level scanning signal.

PA Here, a scanning signal output to the gate lines GL during the reset period must be maintained at the first level, and a scanning signal output to the gate lines GL during the window period must be maintained at the second level, so that each of the shift registers SR can perform gate driving of the X-ray detection panel 110.

The embodiments provide a shift register SR enabling gate driving during the reset period and the window period of the X-ray detection panel 110, as well as a gate driver circuit 120 including the same.

Figure 5:
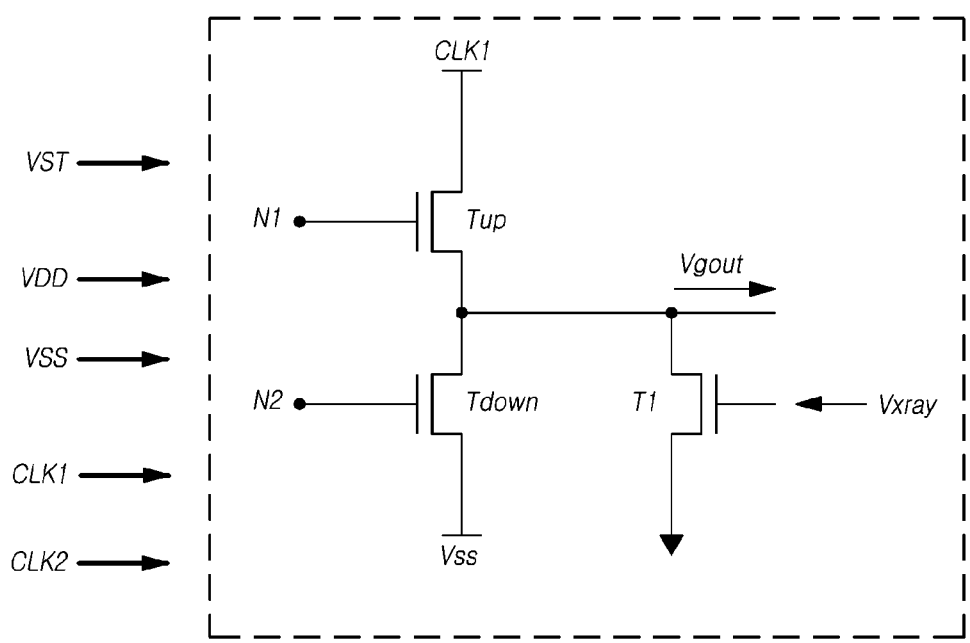
FIGS. 5 and 6 schematically illustrate examples of configurations of shift registers, included in the gate driver circuit, according to an embodiment.
Figure 6:
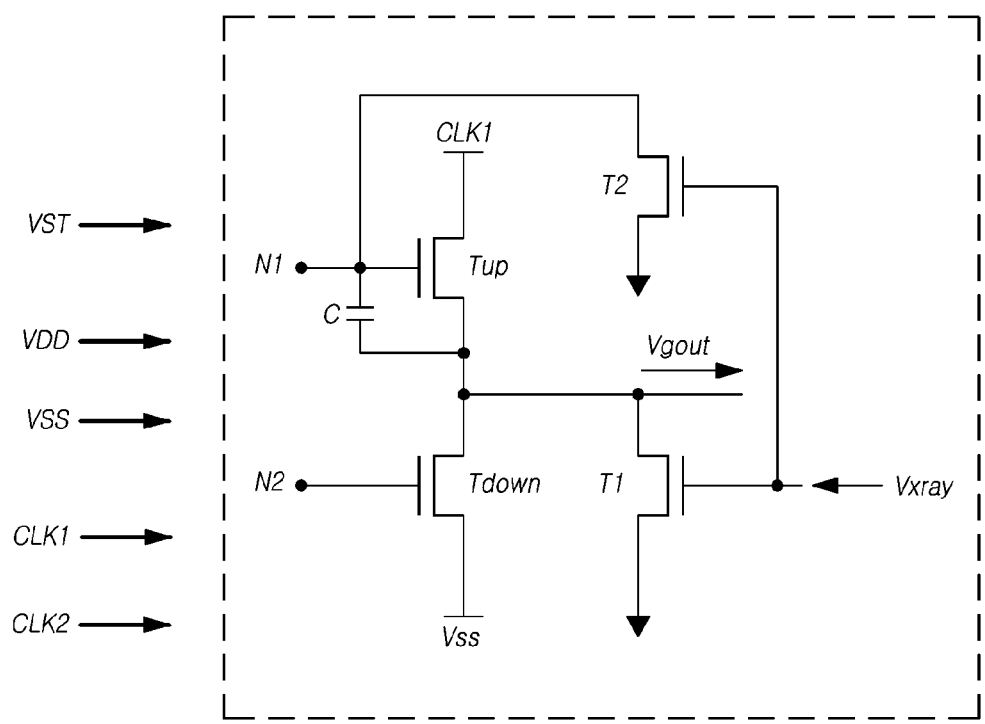

FIGS. 5 and 6 schematically illustrate configurations of shift registers SR, included in the gate driver circuit 120, according to various embodiments.

Referring to FIG. 5, the shift register SR according to the embodiments may include a pull-up transistor Tup controlling a first-level scanning signal to be output to an output terminal and a pull-down transistor Tdown controlling a second-level scanning signal to be output to the output terminal. The shift register SR may further include a first transistor T1 connected to the output terminal. The shift register SR may further include one or more transistors controlling a voltage of a first node N1 and a voltage of a second node N2.

The pull-up transistor Tup is controlled by a voltage of the first node N1. When the voltage of the first node N1 is at a high-level, the pull-up transistor Tup is turned on, thereby controlling a first-level scanning signal to be output to the output terminal. Specifically, when the pull-up transistor Tup is turned on, the pull-up transistor Tup allows a clock signal or a first power voltage VDD to be output therethrough, thereby controlling the first-level scanning signal to be output.

The pull-down transistor Tdown is controlled by a voltage of the second node N2. When the voltage of the second node N2 is at a high level, the pull-down transistor Tdown is turned on, thereby controlling a second-level scanning signal to be output to the output terminal. Specifically, when the pull-down transistor Tdown is turned on, the pull-down transistor Tdown allows a second power voltage VSS to be output therethrough, thereby controlling the second-level scanning signal to be output.

Since the voltage of the first node N1 and the voltage of the second node N2 are controlled in this manner, the shift register SR can output the first-level scanning signal or the second-level scanning signal.

During the reset period in which electrical charges accumulated in the X-ray detection panel 110 are discharged, a scanning signal output by the shift register SR must be maintained at the first level.

The shift register SR according to embodiments can maintain an output scanning signal at the first level by only allowing the first power voltage VDD to be input thereto during the reset period. Specifically, the first power voltage VDD or the second power voltage VSS is input to the shift register SR during the window period or the readout period, and only the first power voltage VDD is input to the shift register SR during the reset period, so that the shift register SR can output a first-level scanning signal.

The first transistor T1 may be connected to the output terminal. For example, the first transistor T1 may be connected between the output terminal and a ground or a terminal to which the second power voltage VSS is input. The first transistor T1 can be controlled by an X-ray incidence signal Vxray incident to the shift register SR.

The X-ray incidence signal Vxray is a signal indicating a start point at which X-rays start to be incident to the X-ray detection panel 110. The X-ray incidence signal Vxray may be a signal that the X-ray detection panel 110 generates and outputs by detecting incident X-rays. The X-ray incidence signal Vxray may be a signal that the controller 140 receives from an external source and outputs to the gate driver circuit 120.

The X-ray incidence signal Vxray may also be a signal that is generated and input, based on a control signal input from an external source at a point in time at which X-rays start to be incident.

For example, the X-ray incidence signal Vxray may be a signal input at a start point of the window period in which electrical charges are generated by the incidence of X-rays.

The first transistor T1 can be turned on in response to the X-ray incidence signal Vxray being applied to a gate node. As the first transistor T1 is turned on, the shift register SR can be discharged through the first transistor T1. Consequently, a scanning signal output from the shift register SR during the window period can be maintained at the second level.

As described above, according to embodiments, the first transistor T1, turned on by the X-ray incidence signal Vxray, is connected to the output terminal and is driven during the window period, so that the switching transistor SWT of each of the pixels P can be maintained in a turned-off state by a scanning signal applied to the gate lines GL of the X-ray detection panel 110 during the window period.

This consequently allows sufficient periods in which electrical charges can be generated in the pixels P to be provided, so that electrical charges can be generated in all of the pixels P during the same period, thereby enabling accurate X-ray reading.

Such a shift register SR may further include a second transistor T2 connected to a gate node of the pull-up transistor Tup in order to maintain a scanning signal, output during the window period, at the second level.

Referring to FIG. 6, the shift register SR according to embodiments includes the pull-up transistor Tup, the pull-down transistor Tdown, and the first transistor T1 connected to an output terminal. In addition, the shift register SR may include the second transistor T2 connected to a gate node of the pull-up transistor Tup. In addition, a capacitor C may be connected between a gate node and a source node of the pull-down transistor Tdown.

The second transistor T2 may be connected to the gate node of the pull-up transistor Tup. For example, the second transistor T2 may be connected between the gate node of the pull-up transistor Tup and a ground or an input terminal of the second power voltage VSS. In addition, the second transistor T2 can be controlled by an X-ray incidence signal Vxray, like the first transistor T1.

For example, the second transistor T2 can be turned on and off during the same period as the first transistor T1.

The second transistor T2 can be turned on in response to the X-ray incidence signal Vxray, input during the window period, being applied to the gate node. As the second transistor T2 is turned on, a voltage of the gate node of the pull-up transistor Tup, i.e., the first node N1, can be discharged.

Consequently, the pull-up transistor Tup controlling a first-level scanning signal to be output to the output terminal is turned off during the window period. This can help the shift register SR output the second-level scanning signal during the window period.

In particular, for driving of the pull-up transistor Tup, the first node N1 of the shift register SR may be configured such that the charging characteristics thereof are significant. For example, as illustrated in FIG. 6, the capacitor C may be connected between the gate node and the source node of the pull-up transistor Tup.

The above-described charging characteristics of the first node N1 may cause noise, which may have an effect on the maintenance of a voltage of the output terminal at an off level.

According to embodiments, the second transistor T2 is additionally provided. The second transistor T2 can be turned on by the X-ray incidence signal Vxray, and can maintain the gate node of the pull-up transistor Tup at the off level during the window period. Consequently, the shift register SR can maintain a scanning signal at the second level during the window period.

Figure 7:
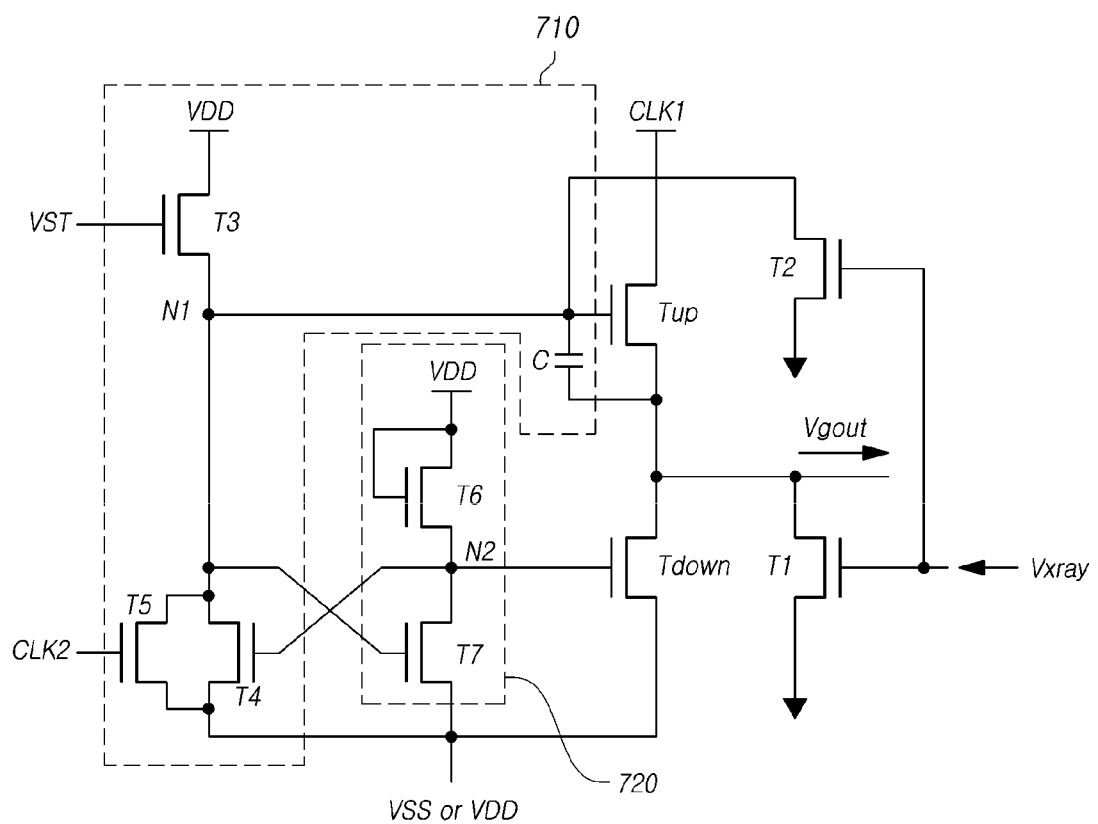
FIG. 7 illustrates an example of the circuit structure of the shift register according to an embodiment.

FIG. 7 illustrates a circuit structure of the shift register SR according to an embodiment.

Referring to FIG. 7, the shift register SR (e.g., each of the shift registers SR1 . . . , etc.) according to the embodiment includes the pull-up transistor Tup, the pull-down transistor Tdown, the first transistor T1, and the second transistor T2. The shift register SR may further include a first node voltage controller 710 controlling a voltage of the first node N1 and a second node voltage controller 720 controlling a voltage of the second node N2.

The circuit structure illustrated in FIG. 7 illustrates an example of the circuit structure controlling the voltage of the first node N1 and the voltage of the second node N2.

The first node voltage controller 710 may include a third transistor T3, a fourth transistor T4, a fifth transistor T5, a capacitor C, and the like.

The second node voltage controller 720 may include a sixth transistor T6 and a seventh transistor T7. The second node voltage controller 720 can have a first power voltage VDD input thereto.

The first node voltage controller 710 and the second node voltage controller 720 can be driven by the first power voltage VDD, a second power voltage VSS, and a variety of timing control signals input to the shifter register SR.

The variety of timing control signals may include a gate start pulse VST, a first clock signal CLK1, and a second clock signal CLK2. The gate start signal VST and the first clock signal CLK1 can have a high level at the same timing, and the second clock signal CLK2 can have a low level when the gate start signal VST or the first clock signal CLK1 is at a high level.

Before a click signal or the like is input to the shift register SR, the sixth transistor T6 of the second node voltage controller 720 is turned on by the first power voltage VDD. As the sixth transistor T6 is turned on, the second node N2 is charged with a voltage. Since the second node N2 is charged with a voltage, the fourth transistor T4 is turned on, thereby causing a voltage of the first node N1 to be discharged. The pull-down transistor Tdown is turned on, and a second-level scanning signal can be output to the output terminal.

When the gate start signal VST is applied to the third transistor T3 of the first node voltage controller 710, the third transistor T3 is turned on, so that the first node N1 is charged with a voltage. When the first node N1 is charged with a voltage, the seventh transistor T7 is turned on, thereby causing the voltage of the second node N2 to be discharged. The pull-up transistor Tup is turned on, and a first-level scanning signal can be output to the output terminal.

In addition, when the second clock signal CLK2 is applied to the fifth transistor T5 of the first node voltage controller 710, the fifth transistor T5 is turned on, so that the voltage of the first node N1 can be discharged. When the voltage of the first node N1 is discharged, the seventh transistor T7 can be turned off, thereby causing the second node N2 to be charged with a voltage. In addition, the pull-up transistor Tup can be turned off. Consequently, a second-level scanning signal can be output to the output terminal again.

In the shift register SR according to embodiments, for gate driving during the reset period of the X-ray detection panel 110, the first power voltage VDD or the second power voltage VSS can be input to the input terminal of power voltages, connected to the second node voltage controller 720.

In addition, for gate driving during the window period, the first transistor T1 connected to the scanning signal output terminal and the second transistor T2 connected to the gate node of the pull-up transistor Tup may further be provided.

Hereinafter, a driving method of the shift register SR illustrated in FIG. 7 will be described with reference to FIGS. 8 to 10.

FIG. 8 illustrates a driving method of the shift register SR illustrated in FIG. 7 during a reset period of the X-ray detection panel 110.

Referring to FIG. 8, the shift register SR operates by receiving a first power voltage VDD and a variety of timing control signals, such as and a clock signal, during the reset period. Specifically, although the shift register SR operates by receiving the first power voltage BDD and a second power voltage VSS, the shift register SR can operate by only receiving the first power voltage VDD during the reset period.

Consequently, the first power voltage VDD is input to a power voltage input terminal connected to the second node voltage controller 720.

Since the first power voltage VDD is input to the power voltage input terminal connected to the second node voltage controller 720, the voltage of the first node N1 can be maintained even in the case in which the fifth transistor T5 is turned off by a second clock signal CLK2. Consequently, the turned-on state of the pull-up transistor Tup is maintained, and a first-level scanning signal can be output.

In addition, even in the case in which the voltage of the second node N2 is charged with the first power voltage VDD, the first power voltage VDD is supplied to the pull-down transistor Tdown, so that the first-level scanning signal can be output to the output terminal.

Consequently, the shift register SR can control the first-level scanning signal to be output to the output terminal during the reset period of the X-ray detection panel 110.

Figure 9:
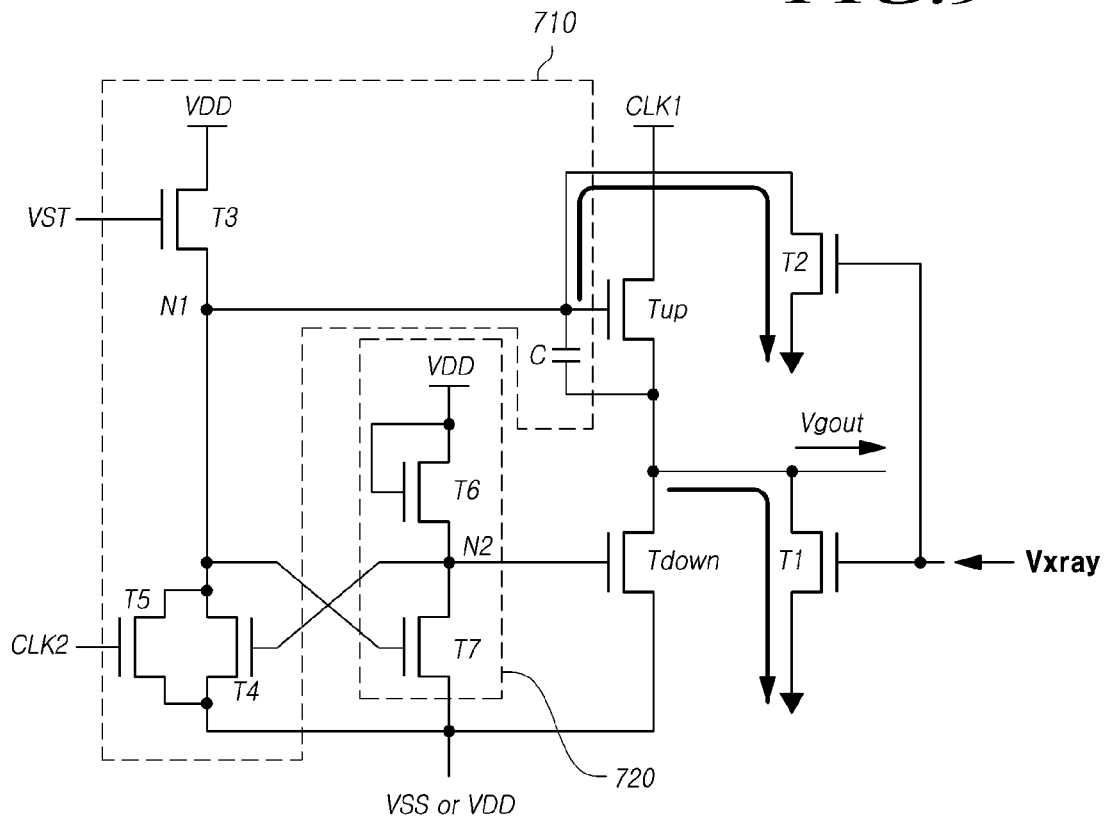
Figure 9:
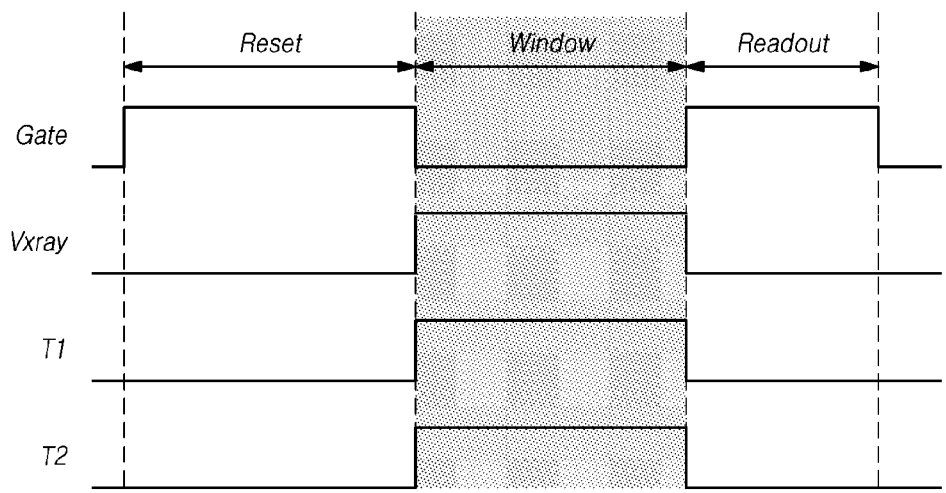

FIG. 9 illustrates a driving method of the shift register SR illustrated in FIG. 7 during the window period of the X-ray detection panel 110.

Referring to FIG. 9, an X-ray incidence signal Vxray generated in response to the incidence of X-rays during the window period is input to the shift register SR. In addition, the input X-ray incidence signal Vxray is applied to the gate node of the first transistor T1 and the gate node of the second transistor T2.

Since the X-ray incidence signal Vxray is applied to the gate node of the first transistor T1, the first transistor T1 is turned on. As the first transistor T1 is turned on, a voltage of the output terminal can be discharged through the first transistor T1. Consequently, a second-level scanning signal can be output to the output terminal.

In addition, since the X-ray incidence signal Vxray is applied to the gate node of the second transistor T2, the second transistor T2 is turned on. When the second transistor T2 is turned on, the voltage of the gate node of the pull-up transistor Tup can be discharged through the second transistor T2.

For example, the voltage charged in the first node N1, for maintaining the pull-up transistor Tup in a turned-on state, can be discharged in response to the operation of the second transistor T2.

Since the voltage of the first node N1, driving the pull-up transistor Tup to be turned on, is discharged, the pull-up transistor Tup can be turned off. Consequently, a scanning signal output to the output terminal can be maintained at the second level.

A second power voltage VSS is input to a power voltage input terminal connected to the second node voltage controller 720. The second power voltage VSS can be input since it is not the reset period. However, even in the case in which the first power voltage VDD is input, the voltage of the output terminal is discharged by the first transistor T1. Consequently, there is no effect on the output of the second-level scanning signal.

As described above, due to the provision of the first transistor T1 and the second transistor T2 operating in response to the X-ray incidence signal Vxray incident during the window period of the X-ray detection panel 110, the second-level scanning signal can be output to the output terminal of the shift register SR during the window period.

Figure 10:
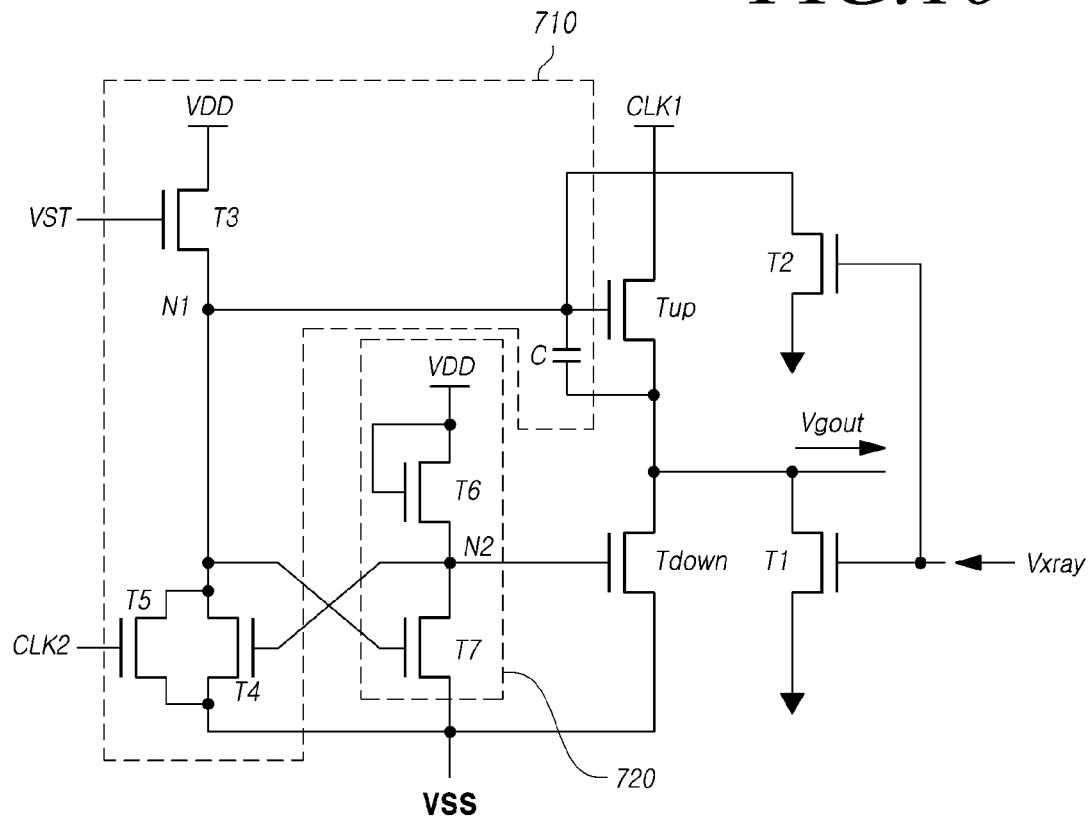
Figure 10:
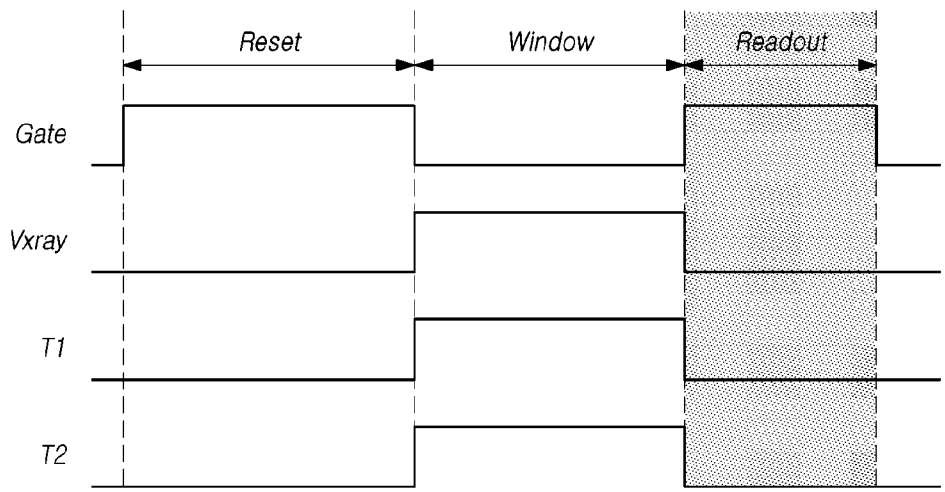

FIG. 10 illustrates a driving method of the shift register SR illustrated in FIG. 7 during a readout period of the X-ray detection panel 110.

Referring to FIG. 10, when a window period is terminated, the input of an X-ray incidence signal Vxray to the shift register SR is stopped. Consequently, the first transistor T1 and the second transistor T2 are turned off.

In addition, a second power voltage VSS is input to a power voltage input terminal connected to the second node voltage controller 720.

Consequently, during the readout period of the X-ray detection panel 110, the shift register SR receives a first power voltage VDD, as well as the second power voltage VSS, and operates in response to a variety of timing control signals, such as a clock signal.

The shift register SR charges a voltage of the first node N1 by receiving an input gate start signal VST or a scanning signal output from another shift register SR, and outputs a first-level scanning signal. When a second clock signal CLK2 is input, the shift register SR outputs a second-level scanning signal, in response to the voltage of the first node N1 being discharged.

As described above, the plurality of shift registers SR in the gate driver circuit 120 can sequentially output a first-level scanning signal, thereby controlling the switching transistors SWT of the pixels P in the X-ray detection panel 110 to be sequentially turned on. In addition, at points in time at which the switching transistors SWT of the pixels P are turned on, levels of electrical charges in the pixels P can be read through the data lines DL.

Since the levels of electrical charges in the pixels P, generated during the window period, are read, X-rays incident to the X-ray detection panel 110 can be read, and a digital image can be generated.

Consequently, the gate driver circuit 120 according to embodiments controls the output of a scanning signal during the reset period or the window period, so that X-rays can be accurately read, based on levels of electrical charges read during the readout period.

In addition, the X-ray detector 100 according to embodiments can efficiently control the timing of the window period by generating an X-ray incidence signal Vxray by detecting incident X-rays, the X-ray incidence signal Vxray turning the first transistor T1 and the second transistor T2 on.

Figure 11:
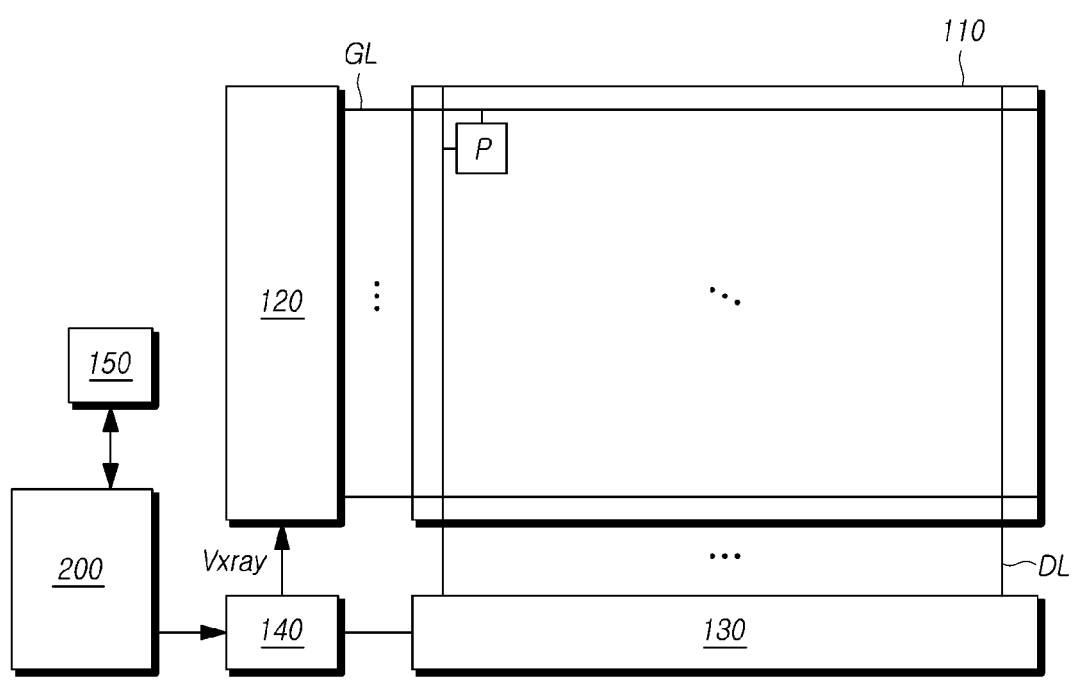
FIG. 11 schematically illustrates another configuration of the X-ray detector according to an embodiment.

FIG. 11 schematically illustrates another example of the configuration of the X-ray detector 100 according to an embodiment.

Referring to FIG. 11, the X-ray detector 100 according to the embodiment may include the X-ray detection panel 110, the gate driver circuit 120, the readout circuit 130, the controller 140, and a sensor 150 detecting X-rays.

The sensor 150 may be disposed, for example, outside of an area of the X-ray detection panel 110 in which the pixels P are disposed.

When X-rays are incident to the X-ray detector 100, the sensor 150 detects the X-rays, and transmits a sensing signal to a host system 200 controlling the X-ray detector 100.

When the sensing signal is received from the sensor 150, the host system 200 can generate and transmit an X-ray incidence signal Vxray to the controller 140. Alternatively, when the host system 200 transmits a signal indicating the incidence of X-rays to the controller 140, the controller 140 may generate the X-ray incidence signal Vxray.

The controller 140 transmits the X-ray incidence signal Vxray, received from the host system 200 or generated in the controller 140 in response to an indication signal from the host system 200, to the gate driver circuit 120.

In addition, the gate driver circuit 120 can control the output of the shift register SR during the window period by turning on the first transistor T1 and the second transistor T2 of the shift register SR, based on the X-ray incidence signal Vxray received from the controller 140.

Since the X-ray detector 100 detects X-rays using the sensor 150 thereof and generates and supplies the X-ray incidence signal Vxray to the gate driver circuit 120 as described above, gate driving for the window period can be performed at a point in time at which X-rays are incident.

Figure 12:
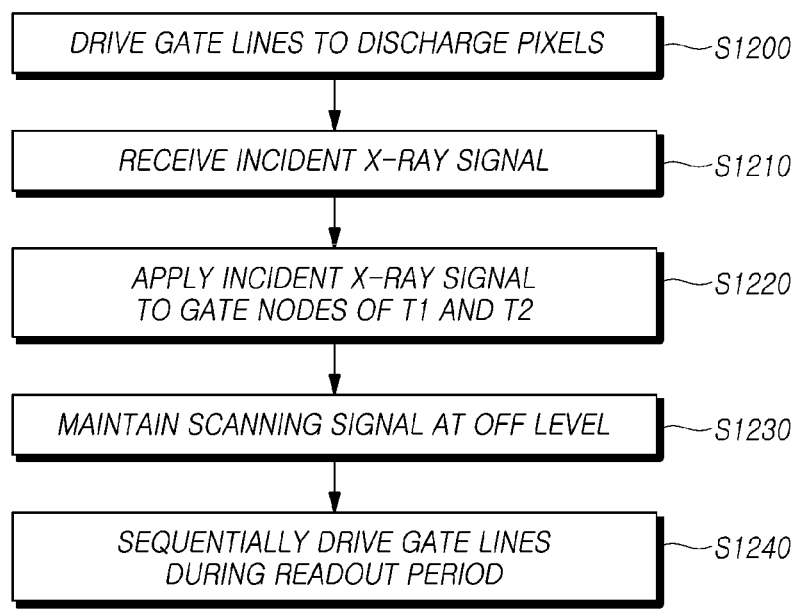
FIG. 12 illustrates a driving method of the gate driver circuit according to an embodiment.

FIG. 12 illustrates a driving method of the gate driver circuit 120 according to an embodiment.

Referring to FIG. 12, in S1200, the gate driver circuit 120 according to the embodiment performs gate line driving for discharging electrical charges from the pixels P by maintaining a scanning signal output to all of the gate lines GL at a first level during a reset period before X-rays are incident.

The gate driver circuit 120 receives an X-ray incidence signal Vxray from the controller 140 in S1210, and applies the received X-ray incidence signal Vxray to the gate nodes of the first transistor T1 and the second transistor T in S1220.

Consequently, in S1230, the gate driver circuit 120 turns on both the first and second transistors T1 and T2 during a window period in which the X-ray incidence signal Vxray is input, thereby maintaining a scanning signal output to all of the gate lines GL at a second level.

When the window period is terminated, the gate driver circuit 120 sequentially outputs a first-level scanning signal to the gate lines GL in the X-ray detection panel 110 during a readout period in S1240, so that the readout circuit 130 reads the levels of electrical charges generated in the pixels P.

According to the foregoing embodiments, the gate driver circuit 120 of the X-ray detector 100 can control the output of a scanning signal before and during the incidence of X-rays. Accordingly, the X-ray detection panel 110 and the X-ray detector 100 that are able to accurately read X-rays can be provided.

In addition, voltages of the output terminal and the first node N1 are maintained at an off level using the first and second transistors T1 and T2 of the shift register SR, operating in response to the X-ray incidence signal Vxray, so that the window period in which electrical charges are generated in the pixels P can be easily controlled.

Furthermore, the gate driver circuit 120 can be provided as a GIP disposed within the X-ray detection panel 110, such that the X-ray detector 100 that is able to accurately read X-rays can be easily provided.

The foregoing descriptions and the accompanying drawings have been presented in order to explain the certain principles of the present disclosure. A person skilled in the art to which the present disclosure relates could make various modifications and variations without departing from the principle of the present disclosure. The foregoing embodiments disclosed herein shall be interpreted as illustrative, while not being limitative, of the principle and scope of the present disclosure. It should be understood that the scope of the present disclosure shall be defined by the appended Claims and all of their equivalents fall within the scope of the present disclosure.

What is claimed is:

1. An X-ray detection panel comprising:
a plurality of gate lines;
a plurality of data lines intersecting the plurality of gate lines;
a plurality of pixels comprising areas defined by the intersection of the plurality of gate lines and the plurality of data lines;
a gate driver circuit outputting a scanning signal to the plurality of gate lines;
a readout circuit detecting signals from the plurality of data lines; and
a controller controlling the gate driver circuit and the readout circuit, and outputting an X-ray incidence signal to the gate driver circuit,
wherein the gate driver circuit outputs a first-level scanning signal simultaneously to the plurality of gate lines during at least a portion of a first period before the X-ray incidence signal is input, and outputs a second-level scanning signal to the plurality of gate lines during a second period in which the X-ray incidence signal is input, and outputs the first-level scanning signal sequentially to the plurality of a third period after the second period.

2. The X-ray detection panel according to claim 1, wherein the gate driver circuit comprises a plurality of shift registers, each of the plurality of shift registers comprising:
a pull-up transistor controlling the first-level scanning signal to be output to an output terminal;
a pull-down transistor controlling the second-level scanning signal to be output to the output terminal; and
a first transistor connected to the output terminal to be turned on by the X-ray incidence signal.

3. The X-ray detection panel according to claim 2, wherein each of the plurality of shift registers further comprises a second transistor connected to a gate node of the pull-up transistor to be turned on by the X-ray incidence signal.

4. The X-ray detection panel according to claim 3, wherein each of the plurality of shift registers further comprises a capacitor connected between the gate node and a source node of the pull-up transistor.

5. The X-ray detection panel according to claim 3, wherein the first transistor and the second transistor are turned on during the second period, and are turned off during the first period.

6. The X-ray detection panel according to claim 3, wherein the X-ray incidence signal is applied to a gate node of the first transistor and a gate node of the second transistor.

7. The X-ray detection panel according to claim 1, further comprising a sensor detecting X-rays incident from an external source,
wherein the controller outputs the X-ray incidence signal to the gate driver circuit when the X-rays are detected by the sensor.

8. A gate driver circuit comprising:
a first shift register outputting a scanning signal to a first gate line; and
a second shift register outputting a scanning signal to a second gate line,
wherein the first shift register and the second shift register output a first-level scanning signal to the first gate line and the second gate line, respectively, during at least a portion of a first period before an X-ray incidence signal is input, and simultaneously output a second-level scanning signal to the first gate line and the second gate line during a second period in which the X-ray incidence signal is input.

9. The gate driver circuit according to claim 8, wherein each of the first shift register and the second shift register comprises:

a pull-up transistor controlling the first-level scanning signal to be output to an output terminal;

a pull-down transistor controlling the second-level scanning signal to be output to the output terminal; and a first transistor connected to the output terminal to be turned on by the X-ray incidence signal.

10. The gate driver circuit according to claim 9, wherein each of the first shift register and the second shift register further comprises a second transistor connected to a gate node of the pull-up transistor to be turned on by the X-ray incidence signal.

11. The gate driver circuit according to claim 8, wherein the first shift register and the second shift register output the first-level scanning signal simultaneously to the first gate line and the second gate line during the at least a portion of the first period, and output the first-level scanning signal sequentially to the first gate line and the second gate line during a third period after the second period.

12. A shift register comprising:
a pull-up transistor controlling a first-level scanning signal to be output to an output terminal;
a pull-down transistor controlling a second-level scanning signal to be output to the output terminal;
a first transistor connected to the output terminal; and
a second transistor connected to a gate node of the pull-up transistor,
wherein the first transistor and the second transistor are turned on simultaneously during a period in which an X-ray incidence signal is input and are turned off except for the period in which the X-ray incidence signal is input.

13. The shift register according to claim 12, wherein
the first transistor is electrically connected between the output terminal and a ground, and
the second transistor is electrically connected between the gate node of the pull-up transistor and the ground.

14. The shift register according to claim 12, further comprising a capacitor electrically connected between the gate node and a source node of the pull-up transistor.

15. An X-ray detector comprising:
a panel provided with a plurality of gate lines, a plurality of data lines, and a plurality of pixels;
a gate driver circuit outputting a scanning signal to the plurality of gate lines;
a readout circuit detecting signals from the plurality of data lines; and
a controller controlling the gate driver circuit and the readout circuit, and outputting an X-ray incidence signal to the gate driver circuit,
wherein the gate driver circuit outputs a first-level scanning signal simultaneously to the plurality of gate lines during at least a portion of a first period before the X-ray incidence signal is input, and outputs a second-level scanning signal to the plurality of gate lines during a second period in which the X-ray incidence signal is input, and outputs the first-level scanning signal sequentially to the plurality of gate lines during a third period after the second period.

* * * * *